(12) United States Patent
Britt et al.

(10) Patent No.: US 10,008,637 B2
(45) Date of Patent: Jun. 26, 2018

(54) LIGHT EMITTER DEVICES AND METHODS WITH REDUCED DIMENSIONS AND IMPROVED LIGHT OUTPUT

(75) Inventors: Jeffrey C. Britt, Cary, NC (US); David T. Emerson, Chapel Hill, NC (US); Raymond Rosado, Apex, NC (US); Justin Lydon, Durham, NC (US)

(73) Assignee: Cree, Inc., Durham, NC (US)

( * ) Notice: Subject to any disclaimer, the term of this patent is extended or adjusted under 35 U.S.C. 154(b) by 308 days.

(21) Appl. No.: 13/312,518

(22) Filed: Dec. 6, 2011

(65) Prior Publication Data

US 2013/0141920 A1 Jun. 6, 2013

(51) Int. Cl.
*F21V 3/00* (2015.01)
*F21V 5/00* (2015.01)
*H01L 33/48* (2010.01)
*H01L 33/54* (2010.01)
*H01L 33/58* (2010.01)
*H01L 33/20* (2010.01)

(52) U.S. Cl.
CPC ............ *H01L 33/486* (2013.01); *H01L 33/54* (2013.01); *H01L 33/58* (2013.01); *H01L 33/20* (2013.01); *H01L 2924/0002* (2013.01)

(58) Field of Classification Search
CPC ........... H01L 33/54; H01L 2924/12041; H01L 25/10; H01L 25/04; H01L 23/13; H01L 23/32; H01L 23/02–23/053; H01L 33/486; F21L 4/027; F21Y 2101/00–2101/02
USPC ................. 362/311.01, 311.15, 335, 249.02; 257/98–99
See application file for complete search history.

(56) References Cited

U.S. PATENT DOCUMENTS

| | | | |
|---|---|---|---|
| 3,288,728 A | 11/1966 | Gorham | |
| 3,609,475 A | 9/1971 | Kaposhilin | |
| 3,875,456 A | 4/1975 | Kano et al. | |
| H000445 H * | 3/1988 | Bock et al. | 264/1.7 |
| H445 H | 3/1988 | Bock et al. | |
| 4,918,497 A | 4/1990 | Edmond | |

(Continued)

FOREIGN PATENT DOCUMENTS

| | | |
|---|---|---|
| CN | 101 047 220 | 10/2007 |
| CN | 101276870 A | 10/2008 |

(Continued)

OTHER PUBLICATIONS

"Press Releases Nichia Corporation" posted to http://www.nichia.com/en/about_nichia/2010/2010_110201.html on Nov. 2, 2010, captured by Wayback Machine on Dec. 1, 2011, accessed on Nov. 7, 2014.*

(Continued)

*Primary Examiner* — Erin Kryukova
(74) *Attorney, Agent, or Firm* — Jenkins, Wilson, Taylor & Hunt, P.A.

(57) ABSTRACT

Light emitter devices and methods with reduced dimensions and improved light output are provided. In one embodiment, a light emitter device includes a submount having an area of approximately 6 square millimeters (mm²) or less. The device can further include a light emitting chip on the submount and a lens disposed over the light emitting chip and positioned on the submount. The device can be operable for emitting light at approximately 100 lumens or higher.

44 Claims, 5 Drawing Sheets

(56) References Cited

U.S. PATENT DOCUMENTS

| | | | |
|---|---|---|---|
| 4,946,547 A | 8/1990 | Palmour | |
| 4,966,862 A | 10/1990 | Edmond | |
| 5,027,168 A | 6/1991 | Edmond | |
| 5,200,022 A | 4/1993 | Kong | |
| 5,210,051 A | 5/1993 | Carter, Jr. | |
| 5,338,944 A | 8/1994 | Edmond | |
| 5,359,345 A | 10/1994 | Hunter | |
| RE34,861 E | 2/1995 | Davis | |
| 5,393,993 A | 2/1995 | Edmond | |
| 5,416,342 A | 5/1995 | Edmond | |
| 5,523,589 A | 6/1996 | Edmond | |
| 5,604,135 A | 2/1997 | Edmond | |
| 5,631,190 A | 5/1997 | Negley | |
| 5,739,554 A | 4/1998 | Edmond | |
| 5,912,477 A | 6/1999 | Negley | |
| 5,959,316 A | 9/1999 | Lowery | |
| 6,120,600 A | 9/2000 | Edmond | |
| 6,121,637 A * | 9/2000 | Isokawa et al. | 257/99 |
| 6,187,606 B1 | 2/2001 | Edmond | |
| 6,201,262 B1 | 3/2001 | Edmond | |
| 6,252,254 B1 | 6/2001 | Soules et al. | |
| 6,350,041 B1 | 2/2002 | Tarsa et al. | |
| 6,576,930 B2 | 6/2003 | Reeh et al. | |
| 6,600,175 B1 | 7/2003 | Baretz | |
| 6,717,353 B1 | 4/2004 | Mueller et al. | |
| 6,791,119 B2 | 9/2004 | Slater, Jr. | |
| 6,853,010 B2 | 2/2005 | Slater, Jr. | |
| 6,860,621 B2 | 3/2005 | Bachl et al. | |
| 6,936,857 B2 | 8/2005 | Doxsee et al. | |
| 6,958,497 B2 | 10/2005 | Emerson | |
| 7,005,679 B2 | 2/2006 | Tarsa et al. | |
| 7,026,661 B2 | 4/2006 | Murano | |
| 7,087,936 B2 | 8/2006 | Negley | |
| 7,095,056 B2 | 8/2006 | Vitta | |
| 7,183,577 B2 | 2/2007 | Mueller-Mach | |
| 7,211,835 B2 * | 5/2007 | Ono | 257/99 |
| 7,213,940 B1 | 5/2007 | Van De Ven | |
| 7,244,965 B2 * | 7/2007 | Andrews et al. | 257/98 |
| 7,246,930 B2 | 7/2007 | Yatsuda et al. | |
| 7,250,715 B2 | 7/2007 | Mueller et al. | |
| 7,304,326 B2 | 12/2007 | Suehiro et al. | |
| 7,344,902 B2 | 3/2008 | Basin et al. | |
| 7,456,499 B2 | 11/2008 | Loh | |
| 7,476,909 B2 * | 1/2009 | Nagai et al. | 257/94 |
| 7,534,635 B1 | 5/2009 | Foust et al. | |
| 7,564,180 B2 | 7/2009 | Brandes | |
| 7,598,669 B2 | 10/2009 | Toguchi et al. | |
| 7,638,811 B2 | 12/2009 | Slater | |
| 7,655,957 B2 | 2/2010 | Loh | |
| 7,709,853 B2 | 5/2010 | Medendorp | |
| 7,791,061 B2 | 9/2010 | Edmond et al. | |
| 7,821,023 B2 * | 10/2010 | Yuan et al. | 257/98 |
| 7,825,575 B2 | 11/2010 | Sawanobori et al. | |
| 7,833,073 B2 * | 11/2010 | Ogawa | 445/24 |
| 7,842,526 B2 | 11/2010 | Hadame et al. | |
| 7,868,343 B2 | 1/2011 | Negley | |
| 7,952,115 B2 | 5/2011 | Loh | |
| 8,011,818 B2 | 9/2011 | Negley | |
| 8,052,307 B2 | 11/2011 | Bak et al. | |
| 8,058,088 B2 | 11/2011 | Cannon | |
| 8,378,379 B2 | 2/2013 | Tanida et al. | |
| 8,398,892 B2 | 3/2013 | Shioi | |
| 8,946,747 B2 | 2/2015 | Reiherzer | |
| 8,957,580 B2 | 2/2015 | Reiherzer | |
| 9,055,700 B2 | 6/2015 | Humphries et al. | |
| 9,240,530 B2 | 1/2016 | Reiherzer | |
| 9,343,441 B2 | 5/2016 | Reiherzer | |
| 9,496,466 B2 | 11/2016 | Hussell et al. | |
| 2002/0004577 A1 | 1/2002 | Biebuyck et al. | |
| 2003/0067761 A1 * | 4/2003 | Horiuchi et al. | 362/31 |
| 2004/0079957 A1 | 4/2004 | Andrews et al. | |
| 2004/0252501 A1 | 12/2004 | Moriyama | |
| 2005/0007783 A1 * | 1/2005 | Ono | F21K 9/00 362/294 |
| 2005/0045898 A1 | 3/2005 | Leu et al. | |
| 2005/0093430 A1 | 5/2005 | Ibbetson et al. | |
| 2005/0159581 A1 | 7/2005 | Vanderzande et al. | |
| 2005/0194609 A1 | 9/2005 | Furukawa | |
| 2005/0224830 A1 | 10/2005 | Blonder et al. | |
| 2006/0091415 A1 | 5/2006 | Yan | |
| 2006/0091788 A1 | 5/2006 | Yan | |
| 2006/0105484 A1 | 5/2006 | Basin | |
| 2006/0113906 A1 | 6/2006 | Ogawa | |
| 2006/0124953 A1 | 6/2006 | Negley et al. | |
| 2006/0138621 A1 | 6/2006 | Bogner | |
| 2006/0145172 A1 | 7/2006 | Se et al. | |
| 2006/0163589 A1 | 7/2006 | Fan et al. | |
| 2006/0181866 A1 | 8/2006 | Jung et al. | |
| 2006/0186418 A1 | 8/2006 | Edmond | |
| 2006/0221272 A1 | 10/2006 | Negley | |
| 2006/0226759 A1 | 10/2006 | Masuda et al. | |
| 2007/0012940 A1 | 1/2007 | Suh et al. | |
| 2007/0090383 A1 | 4/2007 | Ota et al. | |
| 2007/0139923 A1 | 6/2007 | Negley | |
| 2007/0158668 A1 | 7/2007 | Tarsa | |
| 2007/0170447 A1 | 7/2007 | Negley | |
| 2007/0223219 A1 | 9/2007 | Medendorp et al. | |
| 2007/0228387 A1 | 10/2007 | Negley et al. | |
| 2007/0253209 A1 | 11/2007 | Loh | |
| 2007/0268694 A1 | 11/2007 | Bailey et al. | |
| 2008/0012036 A1 | 1/2008 | Loh | |
| 2008/0080165 A1 | 4/2008 | Kim et al. | |
| 2008/0121921 A1 | 5/2008 | Loh | |
| 2008/0173884 A1 | 7/2008 | Chitnis | |
| 2008/0179611 A1 * | 7/2008 | Chitnis et al. | 257/98 |
| 2008/0179617 A1 | 7/2008 | Kadotani | |
| 2008/0198112 A1 | 8/2008 | Roberts | |
| 2008/0237616 A1 * | 10/2008 | Hatakoshi | H01L 33/02 257/94 |
| 2008/0239724 A1 | 10/2008 | Moriyama et al. | |
| 2008/0258130 A1 | 10/2008 | Bergmann | |
| 2008/0081065 A1 | 11/2008 | Bulavin | |
| 2008/0303052 A1 | 12/2008 | Lee et al. | |
| 2008/0308825 A1 | 12/2008 | Chakraborty | |
| 2009/0039375 A1 | 2/2009 | LeToquin | |
| 2009/0050907 A1 | 2/2009 | Yuan | |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 * | 3/2009 | McMillan | 362/231 |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 * | 8/2009 | Braune et al. | 257/99 |
| 2009/0231833 A1 * | 9/2009 | Miki et al. | 362/84 |
| 2009/0236621 A1 | 9/2009 | Chakraborty | |
| 2009/0250714 A1 | 10/2009 | Yun et al. | |
| 2009/0261374 A1 | 10/2009 | Hayashi | |
| 2009/0283779 A1 | 11/2009 | Negley et al. | |
| 2009/0295265 A1 | 12/2009 | Tabuchi et al. | |
| 2009/0309116 A1 | 12/2009 | Kato et al. | |
| 2009/0315057 A1 * | 12/2009 | Konishi et al. | 257/98 |
| 2010/0025699 A1 | 2/2010 | Liu | |
| 2010/0025709 A1 | 2/2010 | Koseki et al. | |
| 2010/0102344 A1 | 4/2010 | Ueji | |
| 2010/0103660 A1 | 4/2010 | Van De Ven et al. | |
| 2010/0133556 A1 | 6/2010 | Li et al. | |
| 2010/0155763 A1 | 6/2010 | Donofrio | |
| 2010/0200874 A1 | 8/2010 | Shioi et al. | |
| 2010/0203657 A1 | 8/2010 | Kim | |
| 2010/0208487 A1 | 8/2010 | Li | |
| 2010/0213502 A1 | 8/2010 | Kashiwagi et al. | |
| 2010/0226130 A1 | 9/2010 | Cheng et al. | |
| 2010/0237375 A1 | 9/2010 | Yamazaki et al. | |
| 2010/0252851 A1 * | 10/2010 | Emerson et al. | 257/98 |
| 2010/0258830 A1 | 10/2010 | Ide et al. | |
| 2010/0283381 A1 | 11/2010 | Takahashi et al. | |
| 2010/0289395 A1 * | 11/2010 | Sun et al. | 313/45 |
| 2011/0001148 A1 | 1/2011 | Sun et al. | |
| 2011/0031513 A1 | 2/2011 | Hsieh et al. | |
| 2011/0046319 A1 | 2/2011 | Ueno et al. | |
| 2011/0108875 A1 | 5/2011 | Takenaka et al. | |
| 2011/0204398 A1 | 8/2011 | Tanida et al. | |

(56) References Cited

U.S. PATENT DOCUMENTS

| | | | |
|---|---|---|---|
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0241049 A1 | 10/2011 | Tanida et al. | |
| 2011/0242806 A1 | 10/2011 | Ramer et al. | |
| 2011/0248289 A1 | 10/2011 | Hsieh et al. | |
| 2011/0253429 A1 | 10/2011 | Humphries et al. | |
| 2011/0272721 A1* | 11/2011 | Butterworth | 257/98 |
| 2011/0278618 A1 | 11/2011 | Nakayama | |
| 2011/0284897 A1 | 11/2011 | Takayama | |
| 2012/0126257 A1 | 5/2012 | Reiherzer et al. | |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1 | 1/2013 | Lin | |
| 2013/0141905 A1 | 6/2013 | Hussell | |
| 2013/0161650 A1 | 6/2013 | Lin | |
| 2013/0168719 A1 | 7/2013 | Watkins et al. | |
| 2013/0207130 A1 | 8/2013 | Reiherzer | |
| 2013/0207141 A1 | 8/2013 | Reiherzer | |
| 2013/0207142 A1 | 8/2013 | Reiherzer | |
| 2013/0208442 A1 | 8/2013 | Reiherzer | |
| 2013/0214298 A1 | 8/2013 | Lin | |

FOREIGN PATENT DOCUMENTS

| | | |
|---|---|---|
| CN | 101438424 A | 5/2009 |
| CN | 101 814 571 A | 8/2010 |
| CN | 102150480 | 8/2011 |
| CN | 102163680 | 8/2011 |
| CN | 201918428 | 8/2011 |
| CN | 102214775 | 10/2011 |
| CN | 102214776 A | 10/2011 |
| CN | 103782402 | 5/2014 |
| CN | 104247055 | 12/2014 |
| CN | 104247060 | 12/2014 |
| CN | 103988324 B | 3/2017 |
| EP | 1536487 | 6/2005 |
| EP | 2056363 A2 | 5/2009 |
| EP | 2365549 A1 | 9/2011 |
| EP | 2786429 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-206015 A | 9/2010 |
| JP | 2010-226093 A | 10/2010 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/0101385 | 7/2013 |

OTHER PUBLICATIONS

Narukawa et al. "White light emitting diodes with super-high luminous efficacy", Journal of Physics D, 43 (2010) 354002.*
"Diameter_Definition of Diameter by Merriam-Webster", accessed at http://www.mirriam-webster.com/dictionary/diameter on Nov. 22, 2016.*
"SCS Parylene Coatings for LEDS," Specialty Coating Systems, 2009, pp. 1-2, Indianapolis, IN, USA.
"SCS Electronic Coatings," Specialty Coating Systems, 2010, pp. 1-4, Indianapolis, IN, USA.
Restriction Requirement for U.S. Appl. No. 13/372,076 dated Jan. 31, 2013.
International Search Report and Written Opinion for Application No. PCT/US2012/047608 dated Jan. 31, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
U.S. Appl. No. 13/372,063, filed Feb. 13, 2012.
U.S. Appl. No. 13/444,394, filed Apr. 11, 2012.
U.S. Appl. No. 13/444,399, filed Apr. 11, 2012.
U.S. Appl. No. 13/372,076, filed Feb. 13, 2012.
U.S. Appl. No. 13/309,117, filed Dec. 1, 2011.
U.S. Appl. No. 13/554,769, filed Jul. 20, 2012.
U.S. Appl. No. 13/312,508, filed Dec. 6, 2011.
Ming Ma, et al., Effects of the refractive index of the encapsulant on the light-extraction efficiency of light-emitting diodes, Optics Express, Sep. 12, 2011, pp. A1135-A1140, vol. 19, No. S5.
Non-Final Office Action for U.S. Appl. No. 13/372,076 dated Aug. 8, 2013.
Restriction Requirement for U.S. Appl. No. 13/309,177 dated Sep. 16, 2013.
Restriction Requirement for U.S. Appl. No. 13/554,769 dated Oct. 9, 2013.
Non-Final Office Action for U.S. Appl. No. 13/312,508 dated Dec. 17, 2013.
Non-Final Office Action for U.S. Appl. No. 13/309,177 dated Feb. 13, 2014.
Non-Final Office Action for U.S. Appl. No. 13/554,769 dated Mar. 18, 2014.
Restriction Requirement for U.S. Appl. No. 13/372,063 dated Apr. 10, 2014.
Restriction Requirement for U.S. Appl. No. 13/691,102 dated Apr. 11, 2014.
Non-Final Office Action for U.S. Appl. No. 13/372,076 dated Mar. 18, 2014.
Non-Final Office Action for U.S. Appl. No. 13/444,394 dated Jul. 22, 2014.
Non-Final Office Action for U.S. Appl. No. 13/372,063 dated Jul. 28, 2014.
Final Office Action for U.S. Appl. No. 13/312,508 dated Aug. 20, 2014.
Non-Final Office Action for U.S. Appl. No. 13/309,177 dated Sep. 11, 2014.
Restriction Requirement for U.S. Appl. No. 13/691,102 dated Oct. 3, 2014.
Final Office Action for U.S. Appl. No. 13/554,769 dated Oct. 16, 2014.
Non-Final Office Action for U.S. Appl. No. 13/444,399 dated Nov. 14, 2014.
Final Office Action for U.S. Appl. No. 13/444,394 dated Jan. 23, 2015.
Taiwanese Office Action for Application No. 101126247 dated Dec. 19, 2014.
Advisory Action for U.S. Appl. No. 13/554,769 dated Jan. 5, 2015.

(56) References Cited

OTHER PUBLICATIONS

Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/309,177 dated Apr. 23, 2015.
Non-Final Office Action for U.S. Appl. No. 13/691,102 dated Apr. 24, 2015.
Non-Final Office Action for U.S. Appl. No. 13/554,769 dated Apr. 27, 2015.
Final Office Action for U.S. Appl. No. 13/444,399 dated Apr. 28, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,508 dated Jul. 22, 2015.
Non-Final Office Action for U.S. Appl. No. 13/444,399 dated Aug. 27, 2015.
Notice of Allowance for U.S. Appl. No. 13/372,076 dated Oct. 7, 2014.
Notice of Allowance for U.S. Appl. No. 13/372,063 dated Oct. 8, 2014.
Notice of Allowance for U.S. Appl. No. 13/372,063 dated Jan. 22, 2015.
Notice of Allowance for U.S. Appl. No. 13/444,394 dated Sep. 11, 2015.
Final Office Action for U.S. Appl. No. 13/309,177 dated Nov. 16, 2015.
Non-Final Office Action for U.S. Appl. No. 13/312,508 Nov. 17, 2015.
Final Office Action for U.S. Appl. No. 13/554,769 dated Dec. 4, 2015.
Notice of Allowance for U.S. Appl. No. 13/444,399 dated Jan. 15, 2016.
Advisory Action for U.S. Appl. No. 13/309,177 dated Feb. 12, 2016.
Examiner-Initiated Interview Summary for U.S. Appl. No. 13/312,508 dated Jul. 1, 2016.
Notice of Allowance for U.S. Appl. No. 13/312,508 dated Jul. 1, 2016.
Non-Final Office Action for U.S. Appl. No. 13/691,102 dated Aug. 5, 2016.
First Chinese Office Action for Application No. 2012 800 440 227 dated Jan. 15, 2016.
Chinese Office Action for Application No. 2012 800604373 dated Feb. 15, 2016.
Final Office Action for U.S. Appl. No. 13/691,102 dated Feb. 25, 2016.
Advisory Action for U.S. Appl. No. 13/554,769 dated Mar. 24, 2016.
Chinese Office Action for Application No. 2012 800 690 449 dated Apr. 6, 2016.
Advisory Action for U.S. Appl. No. 13/691,102 dated May 20, 2016.
Non-Final Office Action for U.S. Appl. No. 13/554,769 dated Jun. 10, 2016.
Non-Final Office Action for U.S. Appl. No. 13/309,177 dated Jun. 9, 2016.
Chinese Office Action for Application No. 2012800440227 dated Aug. 9, 2016.
Final Office Action for U.S. Appl. No. 13/691,102 dated Feb. 10, 2017.
Chinese Office Action for Application No. 2012800440227 dated Feb. 24, 2017.
Non-Final Office Action for U.S. Appl. No. 13/309,177 dated Apr. 11, 2017.
Chinese Office Action for Application No. 2012800690449 dated May 27, 2017.
Final Office Action for U.S. Appl. No. 13/554,769 dated Aug. 9, 2017.
Chinese Office Action for Application No. 2012800690449 dated Nov. 16, 2016.
Final Office Action for U.S. Appl. No. 13/309,177 dated Dec. 21, 2016.
Chinese Notice of Allowance for Application No. 201280060437 dated Dec. 29, 2016.
Non-Final Office Action for U.S. Appl. No. 13/554,769 dated Jan. 18, 2017.

* cited by examiner

LIGHT EMITTER DEVICES AND METHODS WITH REDUCED DIMENSIONS AND IMPROVED LIGHT OUTPUT

TECHNICAL FIELD

The subject matter herein relates generally to light emitter devices and methods. More particularly, the subject matter herein relates to improved light emitter devices and methods with reduced dimensions and improved light output.

BACKGROUND

Light emitting diodes (LEDs) can be utilized in light emitter devices or packages for providing different color points of light, for example, blue, red, and green light, combinations of light having different color points, and white light (e.g., perceived as being white or near-white). Light emitter devices or packages are developing as replacements for incandescent, fluorescent, and metal halide high-intensity discharge (HID) light products. Conventional devices may utilize optical elements such as lenses for improving the amount of light extracted from such devices. One problem with conventional lenses is that various dimensions or ratios such as a lens to submount ratio, edge exclusion, and other dimensions are not fully reduced and/or improved for light extraction. This is because in one aspect, conventional lenses fail to extend near or proximate the edges of the submount. Currently, designers and manufacturers of light emitter devices and lighting products are trending towards using and adapting products which use light emitter devices that are dimensionally smaller. Accordingly, improving light extraction from the light emitter device is becoming more important for maintaining or exceeding expected optical properties, such as brightness levels, expected and required from a given device.

Despite the availability of various light emitting devices in the marketplace, a need remains for devices and methods having improved efficiency and light extraction.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
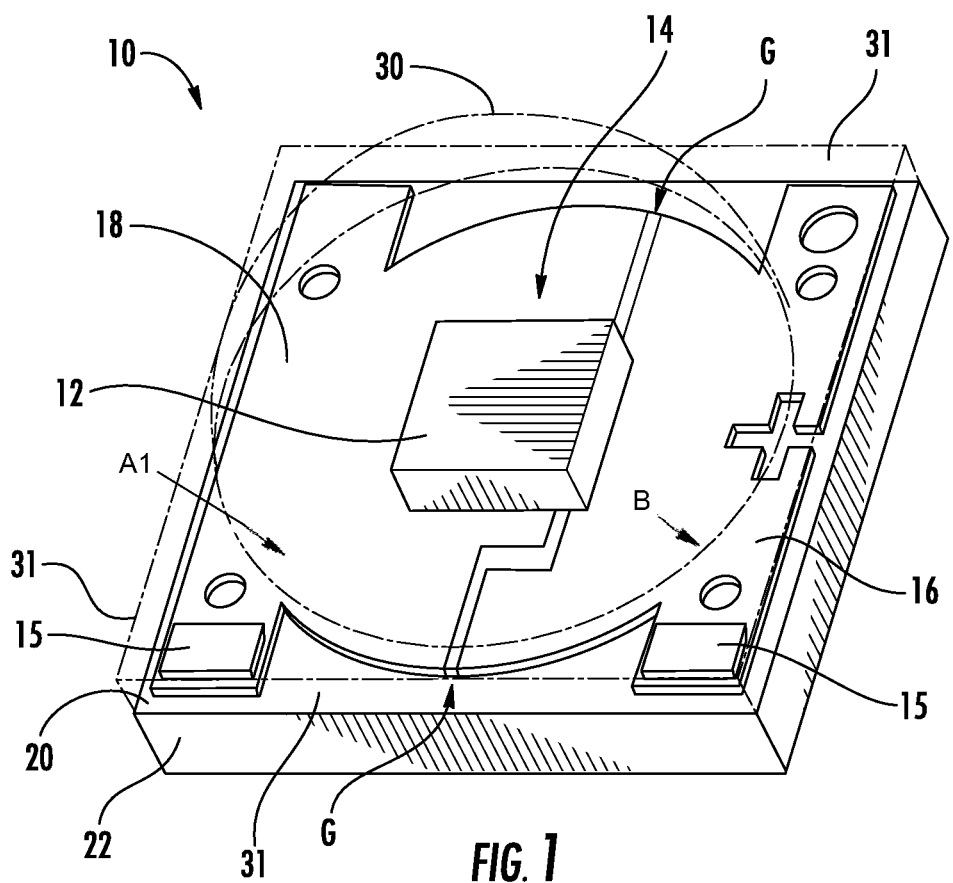
FIG. 1 is a top perspective view of one embodiment of a light emitter device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitting devices according to embodiments described herein can comprise group III-V nitride (e.g., gallium nitride (GaN)) based light emitting diodes (LEDs) or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as AlxGaxN where 1>x>0 are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs according to some embodiments of the present subject matter, for example, can be fabricated on growth substrates (e.g., Si, SiC, or sapphire substrates) to provide horizontal devices (with at least two electrical contacts on a same side of the LED) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED and/or to reduce a forward voltage through a vertical LED. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting area, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LED chips can be at least partially coated with one or more phosphors. The phosphors can absorb a portion of the LED light and emit a different wavelength of light such that the light emitter device or package emits a combination of light from each of the LED and the phosphor. In one embodiment, the emitter device or package emits what is perceived as white light resulting from a combination of light emission from the LED chip and the phosphor. One or more LEDs can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices and methods according to the present subject matter can also have multiple LEDs of different colors, one or more of which can be white emitting.

Referring to the various figures of drawings showing embodiments of light emitter devices and methods, FIGS. 1 to 5 illustrate one configuration or embodiment of a light emitter type, or LED, package or device, generally designated 10, according to the present subject matter. FIGS. 6A to 8 illustrate various embodiments of LED chips that can be incorporated into the novel light emitter packages and devices disclosed herein. Notably, devices and chips described herein can be dimensionally reduced and improved in various dimensional aspects for providing improved light extraction and to achieve the best possible performance relative to dimensional aspects of the device, such as for example the size of the device. Such improvements are advantageous and unexpected in light of conventional devices, which merely arbitrarily used and selected smaller chips for use emitter devices and/or scaled down dimensional aspects of emitter devices without consideration for improved ratios and/or dimensional attributes. In fact, conventional wisdom has been that light emitter packages or devices that are reduced in size would also necessarily be reduced in brightness or light extraction rather than, as with the subject matter herein, reducing and altering dimensional aspects of a conventional, larger light emitter package or device while also surprisingly matching or beating the light output performance of the larger package or device. For example and without limitation, light emitter devices described herein can be operable to emit light at approximately 100 lumens or higher, or any sub-ranges of that, such as 100 to 150 lumens, 150 to 200 lumens, or more than 200 lumens. In one aspect, a light emitter in accordance with the subject matter herein is operable to emit light with an output of approximately 110 lumens per watt or higher when driven at 350 milliamps (mA). In one aspect, devices described herein can be operable is up to and including 1 amp (A). These luminous efficacies can, for example, be under conditions such as 25° C. (77° F.).

Figure 2:
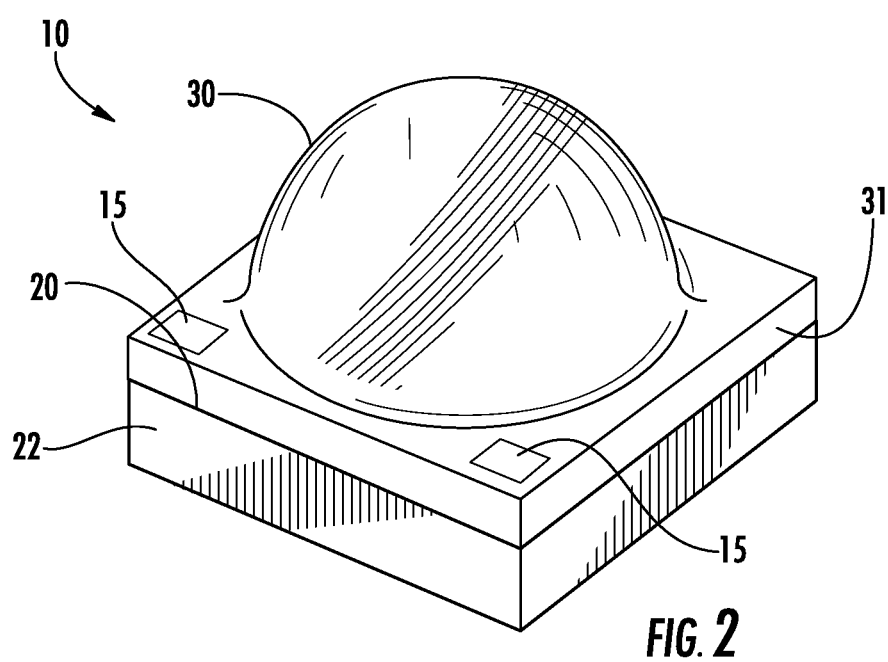
FIG. 2 is another top perspective view of the light emitter device of FIG. 1.

Referring to FIG. 1, a light emitter device generally designated 10 is shown. Light emitter device 10 can comprise various features disposed under a lens 30, which, as illustrated, can comprise a substantially circular lens base B. In FIG. 1, lens 30 appears in broken lines, as lens 30 may be optically opaque as illustrated by FIG. 2. The broken lines in FIG. 1 are for illustration purposes only and denote placement of lens 30 relative to features which may be disposed below lens 30 as such features may not be seen beneath an opaque lens 30 (e.g., see FIG. 2). As used herein, the term "lens area" refers to a surface area, generally designated A1, of a base portion of lens 30 (e.g., B), and can be calculated based upon and/or vary according to the size of a lens diameter (e.g., D1, FIG. 3A). Referring to FIGS. 1 to 4, light emitter device 10 can comprise at least one light emitter such as a solid state emitter or LED chip 12 that can be disposed or arranged over a chip or die attach area referred to herein as a mounting area, generally designated 14. Mounting area 14 can comprise patterned conductive features for passing electrical current into LED chip 12 as well as providing an area for laterally spreading heat. LED chip 12 as shown in FIG. 1 is for illustration purposes only as LED chip can be of any suitable shape or configuration, see for example, FIGS. 6A to 8 describing various feature and/or embodiments of LED chip 12.

In one aspect, LED chip 12 can comprise any of the embodiments depicted by FIGS. 6A to 8 as described further herein. Mounting area 14 can comprise any suitable electrically conductive material known in the art, for example, metals or metal alloys, copper (Cu), aluminum (Al), tin (Sn), silver (Ag), conductive polymer material(s), and/or combinations thereof. Mounting area 14 can be formed integrally with or electrically and/or thermally isolated from electrical components of light emitter device 10. For example, electrical components can comprise first and second electrical contact areas or elements 16 and 18, respectively. First and second electrical elements 16 and 18 can comprise, for example and without limitation, any suitable electrically conducting material known in the art, for example, metals or metal alloys, Cu, Al, Sn, Ag, conductive polymer material(s), and/or combinations thereof.

In one aspect, mounting area 14 and first and second electrical elements 16 and 18 can comprise copper (Cu) deposited using known techniques such as plating. In one aspect, a titanium adhesion layer and copper seed layer can be sequentially sputtered onto submount 22. Then, approximately 75 μm of Cu can be plated onto the Cu seed layer. The resulting Cu layer being deposited can then be patterned using standard lithographic processes. In other embodiments the Cu layer can be sputtered using a mask to form the desired pattern of elements 16 and 18 such that the mask is used to form a gap, generally designated G, by preventing deposition of Cu in that area. In some aspects, mounting area 14 and elements 16 and 18 can be plated or coated with additional metals or materials to the make mounting area 14 more suitable for mounting LED chip 12 and/or to improve optical properties, such as amount of light emitted by device 10. For example, the mounting area 14 and elements 16 and 18 can be plated with adhesive materials, bonding materials, reflective materials, and/or barrier materials or layers. In one aspect, mounting area 14 and elements 16 and 18 can be plated with any suitable thickness of a nickel (Ni) barrier layer and a reflective Ag layer disposed over the Ni barrier layer for increasing reflection from device 10.

Still referring to FIGS. 1 to 4 and in general, mounting area 14 and first and second electrical elements 16 and 18 can be disposed over and/or attached to a top surface 20 of a substrate or submount 22. In one aspect, mounting area 14 can be integrally formed with and as an extension of first and/or second electrical elements 16 or 18, respectively. First electrical element 16 and second electrical element 18 can be physically separated and electrically and/or thermally isolated from each other such as by gap G. For illustration purposes, only one LED chip 12 is shown, however, multiple LED chips 12 having similar or different wavelengths of light are also contemplated. Gap G can extend down to top surface 20 of submount 22 thereby electrically and thermally isolating electrical elements 16 and 18. In one aspect, gap G can provide electrical isolation between the first and second electrical elements 16 and 18 to prevent shorting of the electrical signal applied to LED chip 12.

To improve heat dissipation of light emitter device 10, mounting area 14 and electrical elements 16 and 18 can provide laterally extending thermally conductive paths for conducting heat away from LED chip 12 such that it can spread to other areas of submount 22 beyond areas just below LED chip 12. For example, mounting area 14 can cover more surface area of top surface 20 of submount 22 than that covered by LED chip 12. Mounting area 14 can extend proximate or to the edges of submount 22. In the embodiment shown, mounting area 14 is generally circular and extends radially from LED chip 12 toward the edges of submount 22. It is understood that mounting area 14 can comprise any suitable shape and/or size and that in some embodiments it can extend flush with the edge of submount 22.

In general, LED chip 12 as described herein can embody a solid state emitter used alone and/or in combination with one or more phosphors or lumiphors to emit light of various colors, color points, or wavelength ranges, such as the following: (1) primarily blue wavelengths (preferably approximately 430 nm to 480 nm; optionally 430-475 nm, 440-475 nm, 450-475 nm, or any suitable sub-range of 430-480 nm); (2) primarily cyan wavelengths (preferably approximately 481 nm to 499 nm); (3) primarily green wavelengths (preferably approximately 500 nm to 570 nm, optionally 505-515 nm, 515-527 nm, or 527-535 nm, or 535-570 nm, or any suitable sub-range of 500-570 nm a or any suitable sub-range of 500-570 nm); (4) primarily yellow wavelengths (preferably approximately 571 to 590 nm); and (5) primarily red wavelengths (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range of 591 to 750 nm).

In one aspect, light emitter device 10 can comprise one LED chip 12 that can be primarily blue, which when illuminated can activate a yellow phosphor disposed over LED chip 12 (e.g., phosphor can be at least partially directly disposed over LED chip 12 and/or on a portion of device 10 that is disposed over LED chip 12, for example, such as a lens 30) such that the LED chip 12 comprises a blue shifted yellow (BSY) LED chip 12. In an alternative embodiment, a primarily red LED chip 12 can also be included and disposed below phosphor, encapsulant, and/or lens 30 for mixing to produce warm white output. Light emitter device 10 can also comprise an LED chip 12 configured to activate a red phosphor either disposed over LED chip 12 and/or over a portion of device 10, as for example, red phosphor can be disposed on or in a portion of lens 30 for producing warm white output. In yet a further alternative embodiment, device 10 can comprise more than one LED chip 12 such as a plurality of LED chips. The plurality of LED chips 12 can comprise approximately the same wavelength (e.g., selected from the same targeted wavelength bin) or at least a first LED chip of the plurality of LED chips 12 can comprise a different wavelength from a second LED chip of the plurality of LED chips 12 (e.g., at least a first LED could be selected from a different targeted wavelength bin than a second LED). As noted earlier, one or more LED chips 12 can be provided in device 10 and can comprise one or more combinations of color points or wavelengths. For example, one or more LED chips 12 can emit primarily blue, green, red, yellow, cyan, amber wavelength(s), and any combinations thereof.

LED chip 12 can be mounted to mounting area 14 of device 10 using any suitable known method and material, for example and without limitation, by using conventional solder materials that may or may not contain a flux material, dispensed polymeric materials that may be thermally and electrically conductive, preform attachment, flux or no-flux eutectic attachment, silicone epoxy attachment, metal epoxy attachment, thermal compression attachment, and/or combinations thereof. LED chip 12 can comprise different semiconductor layers arranged in different ways. LED structures and their fabrication and operation are generally known in the art and are therefore only briefly discussed herein.

LED chip 12 can comprise electrical contacts (e.g., an anode and a cathode) on one or more surfaces of chip 12. In one aspect, LED chip 12 can be vertically structured such that a first electrical contact is on a first surface and a second electrical contact is on a second surface of LED chip 12 which opposes the first surface. In this case a wire bond (not shown) can be used to electrically connect LED chip 12 to first and/or second elements 16 and 18, respectively. In other aspects, LED chip 12 can comprise a horizontally structured device having both electrical contacts (e.g., the anode and the cathode) on the same surface, for example, a bottom surface. In this aspect, wire bonds (not shown) may not be necessary, as contacts may electrically connect to first and second electrical elements 16 and 18 via die attach methods/materials. LED chip 12 of FIG. 1 can comprise a horizontally structured device with both electrical contacts on the bottom surface. The bottom surface can electrically connect with each of first and second elements 16 and 18 via die attach materials, for example, solder, epoxy or flux materials. In this aspect, LED chip 12 can be at least partially disposed over gap G such that the anode and the cathode are electrically isolated.

Referring to FIGS. 1 to 4, emitter device 10 can further and optionally comprise top side electrical contacts 15. In one aspect, top side electrical contacts 15 can be disposed over and electrically communicate with first and second electrical elements 16 and 18. As illustrated in FIG. 2, top side electrical contacts 15 can extend through protective layer 31 such that an external component (not shown) can attach to contacts 15 via soldering or any other attachment method to electrically connect to emitter device 10. Top side electrical contacts 15 are optional and can comprise any suitable electrically conductive material known in the art, for example, a metal, metal-alloy, Cu, Ag, Sn, electrically conductive ceramic, and/or polymeric material. In other aspects, top side electrical contacts 15 can comprise a body which receives an external electrical component (not shown, e.g., an electrical wire) and crimps, clamps, or otherwise retains the electrical component.

Referring to FIGS. 1 to 5, submount 22 can comprise any suitable material, and can be electrically and/or thermally conductive or non-conductive. In one aspect, submount 22 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, submount 22 can comprise a plastic material such as polyimide (PI), polyamide (PA), polyphthalamide (PPA), liquid crystal polymer (LCP), or silicone. In other embodiments submount 22 can comprise a printed circuit board (PCB) and variations thereof, sapphire, silicon, or any other suitable material, such as T-Clad thermal clad insulated substrate material, available for example from The Bergquist Company of Chanhassen, Minn. For PCB embodiments and variations thereof, different PCB types can be used such as standard FR-4 PCB, metal core PCB (MCPCB), or any other type of PCB available. In various aspects, it may be desirable to select a submount 22 comprising a material which is a good electrical insulator with low thermal resistance or high thermal conductivity (e.g., AlN).

Some materials that may be used as submount 22 have a thermal conductivity of approximately 30 W/m·K or higher, such as zinc oxide (ZnO). Other acceptable materials have thermal conductivities of approximately 120 W/m·K or higher, such as AlN which has a thermal conductivity that can range from 140-180 W/m·K. In terms of thermal resistance, some acceptable submount 22 materials have a thermal resistance of 2° C./W or lower. Other materials may also be used as submount 22 that have thermal characteristics outside the ranges discussed herein. Notably, and as described further herein, various dimensions of submount 22 can be reduced with respect to other dimensions, for example, LED chip 12 sizes and/or various lens 30 sizes to unexpectedly result in improved ratios for achieving increased light extraction and efficiency in smaller packages or devices.

Figure 3A:
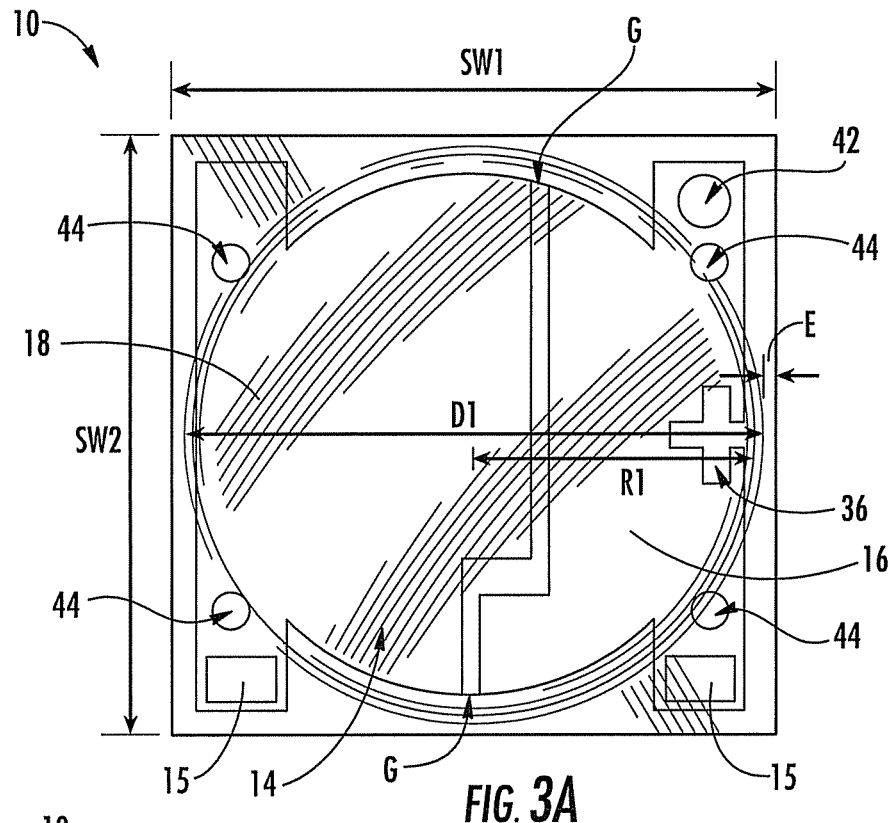
FIGS. 3A and 3B are top plan views of the light emitter device of FIG. 1.

In one aspect, multiple light emitter devices 10 can be formed from a single, large submount panel, wherein individual devices can be singulated from the large panel. Individual devices can be singulated via dicing, sawing, cutting, breaking, or any other suitable method capable of singulating individual device submounts 22 from the larger submount panel. Upon singulation, submount 22 can comprise any size and/or shape, for example, a substantially square, rectangular, circular, oval, regular, irregular, or asymmetrical shape. In one aspect and as illustrated in FIG. 3A, submount 22 can comprise a substantially square shape having a first side of a first width SW1 and a second side of a second width SW2. In one aspect, first side SW1 can comprise a width of approximately 2.5 millimeters (mm) or less in at least one direction. In other aspects, SW1 can be substantially the same dimension as SW2 such that the dimensions are the same in at least two directions. For example, each side SW1 and SW2 can comprise approximately the same width of 2.5 mm in at least two optionally orthogonal directions or less yielding a surface area of approximately 6.25 mm² or less. For example, in one aspect, submount 22 can comprise a square where each side SW1 and SW2 can be approximately 2.45 mm or less yielding a surface area of approximately 6 mm² or less. Submounts 22 having smaller sides and/or surface areas, for example, where one or more side widths SW1 and/or SW2 can be approximately 2.0 mm or less (e.g., 1.5 mm, 1.0 mm, and 0.5 mm or less) in one or two directions are also contemplated herein, and various dimensions of device package, for example, a lens to submount ratio, can be improved to maximize light extraction from smaller packages.

Still referring to FIGS. 1 to 4 in general, light emitter device 10 can further comprise a lens 30. Lens 30 can be formed over top surface 20 of submount 22 and disposed over the at least one LED chip 12. Lens 30 can provide both environmental and/or mechanical protection of device 10. Lens 30 can be disposed at different locations with respect to top surface 20 of submount 22, for example, in one aspect lens 30 can be located as shown having LED chip 12 disposed at least approximately below a center of lens 30 where it is of a maximum height. Lens 30 can comprise a protective layer 31 which can extend flush with sides of device 10 to cover portions of device 10, such as corners of device. Protective layer 31 can be at least partially flat or horizontal with respect to portions of lens 30. In one aspect, lens 30 and protective layer 31 can comprise the same material. In one aspect, lens 30 and protective layer can be molded using different molding techniques and can comprise any suitable material compatible with a molding process. In one aspect, lens 30 and protective layer 31 can comprise, for example without limitation, silicones, plastics, epoxies, glasses, or combinations thereof. In one aspect, silicone is suitable for molding and provides suitable optical transmission properties. It can also withstand subsequent reflow processes and does not significantly degrade over time.

As known in the art, molds (not shown) comprising cavities can be loaded over the large submount panel (e.g., large panel previously described prior to singulation) where each cavity is arranged over at least one LED chip 12. A lens material and/or encapsulant in liquid form can be dispensed in the mold to fill cavities surrounding LED chip 12. In one aspect, lens 30 can comprise liquid curable silicone. LED chip 12 can become embedded in the liquid silicone within a respective one of the cavities. The liquid silicone can then be optionally cured using known curing processes. The mold can then be removed such that a plurality of lenses such as lens 30 conforming to the shape of a given cavity is provided, where each lens 30 can be disposed over a respective one of LED chips 12. Individual light emitter devices, such as device 10 (comprising a submount 22, LED chip 12, and lens 30 can then be singulated from the large submount panel using any suitable singulation method, for example and as previously described, such as dicing, sawing, cutting, breaking etc. The lens arrangement of light emitter device 10 can also be easily adapted for use with a secondary lens or optics that can be placed over lens 30 by the end user to facilitate beam shaping. Such secondary lenses are generally known in the art, with many of them being commercially available. Lens 30 can be optically clear, colored, transparent, semi-transparent, opaque, and/or combinations thereof. It is also understood that lens 30 can be textured to improve light extraction or lens 30 can contain a selective amount of optional additional materials such as amounts of one or more phosphors, diffusers, or light-scattering particles.

Figure 3B:
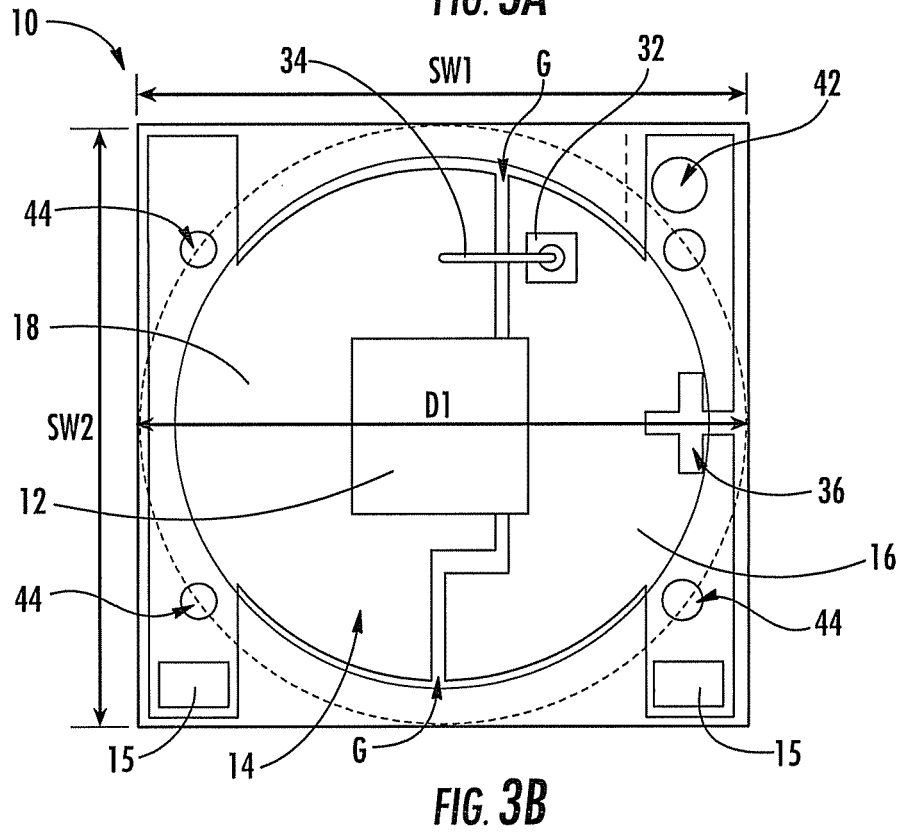

FIGS. 3A and 3B illustrate various light emitter device 10 dimensions which can be provided and unexpectedly achieve highly advantageous performance in regards to maximized light extraction and efficiency based upon the smaller device size. For example, lens 30 diameter D1 and/or radius R1 can be improved with respect to previously described sides SW1 and SW2 and/or the surface area (e.g., product of SW1 and SW2) of submount 22. In one aspect, lens 30 diameter D1 and/or radius R1 can be improved by minimizing an amount of edge exclusion E between edges of lens 30 and submount 22. FIG. 3A illustrates lens 30 where the diameter D1 does not extend flush with sides of submount, and FIG. 3B illustrates lens 30 where diameter D1 does extend flush with sides of submount, thereby minimizing the amount of edge exclusion E between the lens and one or more edges of submount 22. For example, and in one aspect, lens 30 can comprise a diameter D1 of approximately 2.0 mm or more with a radius R1 of approximately 1.0 mm or more. For example, diameter D1 can comprise approximately 2.172 mm or more with a radius R1 of approximately 1.086 mm or more. Various sub-ranges of lens 30 diameters D1 and radii R1 are contemplated, for example, diameter can range from approximately 2.0 mm to approximately 2.5 mm or more such that it is flush with submount 22, and comprising, for example, the same width as submount widths SW1 and/or SW2.

In general, as diameter D1 increases, edge exclusion E decreases. In one aspect, edge exclusion E (e.g., the length or area between the base of lens 30 and an edge of submount 22) can range between approximately zero (0) and 0.5 mm for at least one edge of submount 22. Any sub-range of edge exclusion is contemplated, for example, 0 to 0.3 mm, or 0.3 mm or more. In other aspects, as FIG. 3B illustrates, edge exclusion E can be approximately zero (0) such that the lens extends all the way to at least one edge of submount 22. In further aspects, lens 30 can extend all the way to at least two or more different edges of submount such that edge exclusion E is approximately zero (0) mm on more than one edge of submount 22. In still further aspects, edge exclusion E can extend all the way to each edge of submount 22 such that device 10 has an edge exclusion of approximately zero (0) mm for all edges of submount 22. Notably, and as FIG. 3B illustrates, even where edge exclusion E is approximately (0) mm, top side electrical contacts 15 can still be optionally implemented with device 10.

In one aspect, lens 30 size can be improved with respect to submount 22 size(s) or dimension(s). For example, a ratio between the width of the lens 30 (e.g., diameter of lens D1) and a width of submount 22 (e.g., SW1 and/or SW2) can comprise approximately 0.85 or more. In one aspect, this ratio can be improved by minimizing edge exclusion E thereby maximizing lens/substrate width ratio to get the largest possible lens. In one aspect, width of lens 30 to width of submount 22 can comprise a ratio of approximately 0.887. Improving this ratio can advantageously increase light extraction and efficiency of device 10 to maintain and/or exceed brightness levels of approximately 100 lumens or more as devices become dimensionally smaller. In one aspect, the ratio of lens 30 width or diameter D1 to widths SW1 or SW2 of submount 22 can comprise any sub-range from approximately 0.85 to 1, for example 0.85 to 0.87; 0.87 to 0.9; 0.9 to 0.92; 0.92 to 0.95; 0.95 to 0.98; and 0.98 to 1. A ratio of lens 30 area (e.g., surface area A1, FIG. 1) and submount 22 area (e.g., product of SW1 and SW2) can also be improved for increasing light extraction. Such improvements can for example comprise improving the ratio between an area of lens (e.g., surface area A1, FIG. 1) 30 and an area of submount 22 to approximately 0.60 or more. In one aspect, area of lens 30 and area of submount 22 can comprise a ratio of approximately 0.617. Any sub-range of ratio between area of lens 30 and area of submount 22 is contemplated, for example, 0.60 to 0.61; 0.61 to 0.62; 0.62 to 0.63; 0.63 to 0.65; or greater than 0.65.

As FIG. 3B further illustrates, light emitter device 10 disclosed herein can further optionally comprise one or more elements to protect against damage from electrostatic discharge (ESD). Different elements can be used such as various vertical silicon (Si) Zener diodes, different LEDs arranged in parallel and reverse biased to LED chips 12, surface mount varistors and lateral Si diodes. The arrangement of LED chip 12 and ESD protection device 32 allows excessive voltage and/or current passing through light emitter device 10 from an ESD event to pass through protection device 32 instead of LED chip 12 thereby protecting LED chip 12 from damage. In the embodiments shown, a vertically structured ESD protection device 32 can be utilized and mounted over mounting area 14 using known mounting techniques. ESD protection device 32 can be reverse biased with respect to LED chip 12, and can electrically connect to second electrical element via wire bond 34. ESD protection device 32 can be relatively small in comparison to LED chip 12 such that it does not cover an excessive area on the surface of mounting area 14 and/or submount 22 and therefore does not block a significant amount of light emitted from LED chip 12. ESD protection device 32 can also be positioned close to an edge of lens 30 such that it does not block light from the center of device 10. It is understood that in some aspects, light emitter devices described herein can be provided without an ESD protection device 32 or, in an alternative, an ESD protection device 32 can be located external to the light emitter device(s).

FIGS. 3A and 3B further illustrate device 10 comprising at least one symbol or indicator, generally designated 36. Indicator 36 can indicate electrical polarity of device 10 and ensure accurate mounting of light emitter device 10 over an external source such as a PCB, driving circuit, power circuit, or other external substrate or source of electrical current. For example, a first surface mount area 38 (FIG. 5) can electrically communicate with first electrical element 16 and can be mounted over a positive side of an electrical source to drive current through LED chip 12 of device 10. In the example shown, indicator 36 comprises a plus (+) sign formed in first electrical element 16 indicating that device should be mounted such that positive electric current flows into first surface mount area 38 (FIG. 5), and then into first electrical element 16 via an electrically conductive pathway or via, generally designated 44, and then finally into LED chip 12.

Figure 4:
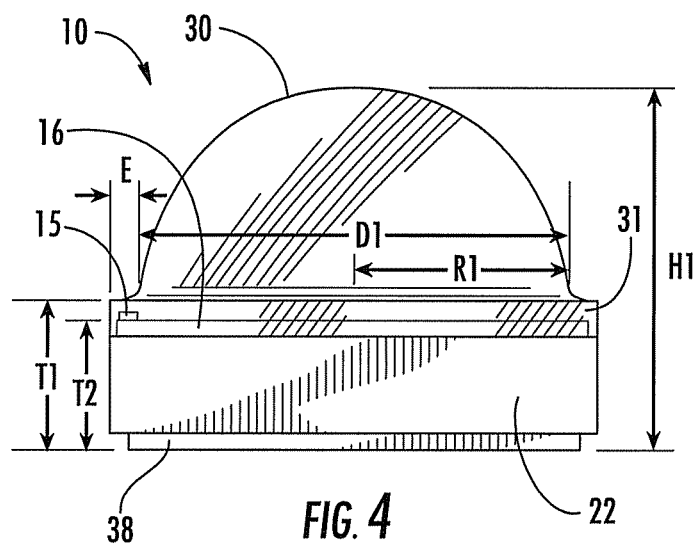
FIG. 4 is a side view of the light emitter device of FIG. 1.
Figure 5:
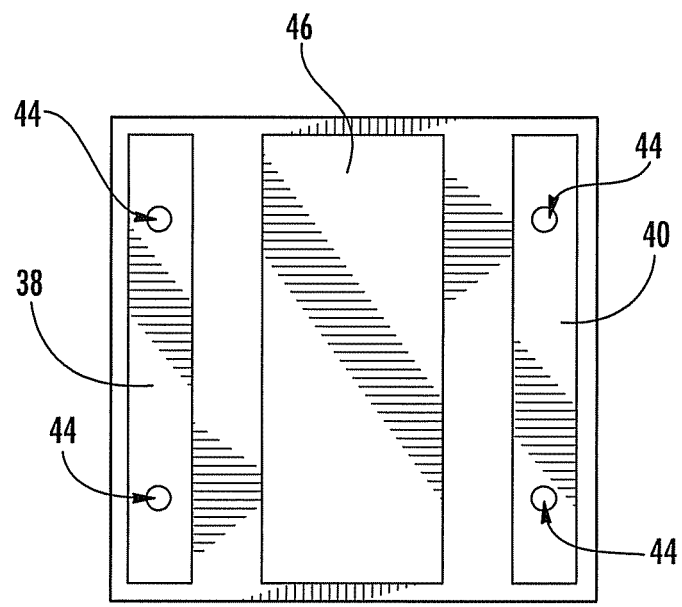
FIG. 5 is a bottom plan view of the light emitter device of FIG. 1.
Figure 6:
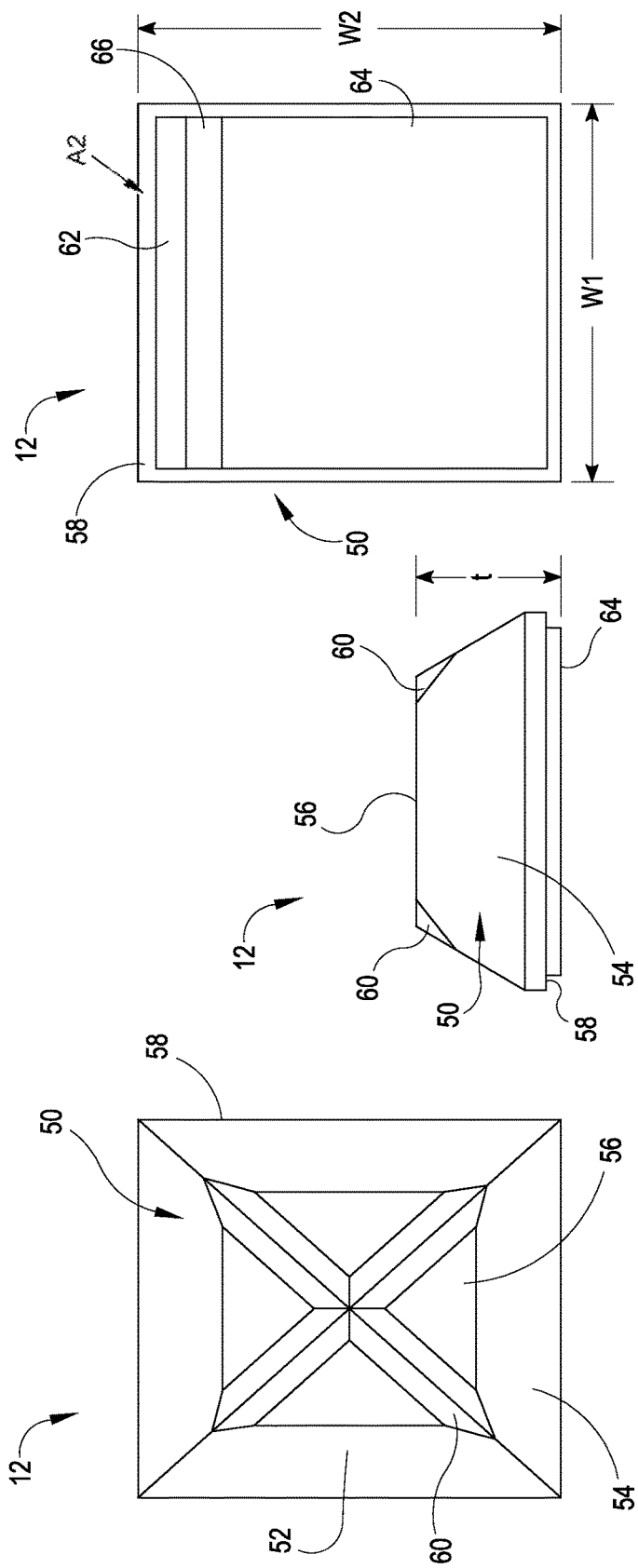
FIGS. 6A to 6C are a top view, a cross-section, and a bottom view, respectively, of a light emitting chip according to the disclosure herein.

Negative electrical current can flow out of LED chip 12 and into second element 18 and then into a second surface mount area 40 (FIGS. 3A to 4) transferred by conductive via 44 (e.g., see also vias 44 in FIG. 5). Second electrical element 18 can electrically communicate and/or be electrically coupled with second surface mount area 40 (FIG. 5) such that electric current can flow out of device 10 and into to the external substrate such as a PCB, power source, driving circuit, or other circuit or source of electrical current. At least one alignment marker, generally designated 42 can also be present on device 10 and can comprise a marker used during fabrication of the electrical elements to ensure adequate alignment of, for example, a mask during deposition, etching, and/or plating of electrical elements 16 and 18. It is understood that indicator 36 and markers 42 can comprise many different symbols, shapes, and/or indicator types. Symbols or indicators 36 can also be included over second electrical element 18, if desired. It is also understood that the symbols or markers can be placed in other locations other than over electrical elements 16 and 18.

FIG. 4 is a side view of device 10. As described earlier, various aspects of lens 30 and submount 22 dimensions and/or ratios can be reduced and improved for advantageously increasing light extraction. In one aspect, lens diameter D1 and/or radius R1 can be reduced and improved with respect to reductions in submount widths SW1 and/or SW2 (FIGS. 3A and 3B) by minimizing edge exclusion E. As FIG. 4 illustrates, device 10 can comprise an overall package height H1. Height H1 can for example and without limitation be approximately 1.85 mm or less. In one aspect, H1 can be approximately 1.84 mm. In other aspects, height H1 can be various sub-ranges including less than 1.0 mm; 1.0 mm to 1.2 mm; 1.2 mm to 1.4 mm; 1.4 to 1.6 mm; 1.6 to 1.8 mm; and greater than 1.8 mm. Device 10 can comprise a base thickness T1 comprising the thickness of submount 22, surface mount area 38 and protective area 31. Base thickness T1 can for example be approximately 0.8 mm or less, such as 0.76 mm. Thickness T1 can comprise various sub-ranges, including less than 0.5 mm; 0.5 mm to 0.6 mm; 0.6 mm to 0.7 mm; and 0.7 mm to 0.8 mm. Device 10 can further have a submount thickness T2 of approximately 0.65 mm or less. Submount thickness T2 can include the thickness of surface mount area 38, submount 22, and electrical element 16. Thickness T2 can comprise various sub-ranges, including less than approximately 0.4 mm; 0.4 to 0.5 mm; 0.5 to 0.6 mm; and 0.6 to 0.65 mm.

Lens 30 can comprise any suitable cross-sectional shape depending on the desired shape of the light output. For example, one suitable cross-sectional shape as shown is hemispheric, with some examples of alternative shapes being ellipsoid, bullet, flat, hex-shaped, and square. Lens 30 can comprise an apex, or point of maximum height, centrally disposed above a center of submount 22 as shown, or the apex can be located off-center with respect to submount 22. Lens 30 can also comprise more than one apex of equal height.

FIG. 5 is a bottom view of device 10. Device 10 can further comprise surface mount area 38 and 40 for electrically connecting to an external power source or circuit (not shown). Surface mount area 38 and 40 can be disposed essentially vertically below portions of first and second electrical elements 16 and 18, respectively. An external source (not shown) can pass an electrical current or signal to device 10 via communication of signal to surface mount areas 38 and 40 when device 10 mounts over the external source. For example, first and second surface mount areas 38 and 40 can electrically communicate to solder contacts or other conductive paths located on the external source (not shown), and can in turn pass current into first and second electrical elements 16 and 18, respectively via conductive paths internally disposed within submount 22. The external source can comprise a PCB, MCPCB, driving circuit, power source, or any other suitable external electrical current source capable of passing electrical current into surface mount areas 38 and 40. In the embodiment shown, light emitter device 10 can be arranged for mounting to an external substrate or source using surface mount technology and device 10 can comprise internal electrically conductive paths connecting surface mount areas 38 and 40 to elements 16 and 18, respectively. Internal electrically conductive paths can comprise one or more conductive vias, generally designated 44.

One or more conductive vias 44 can extend through submount 22 between first surface mount area 38 and first electrical element 16 such that when electric current or signal is applied to the first surface mount area 38 it is conducted through submount 22 and into first electrical element 16. Similarly, one or more conductive vias 44 can be formed extending between second surface mount area 40 second electrical element 18 to conduct an electrical signal between the two. First and second surface mount areas 38 and 40 can allow for surface mounting of device 10 with the electrical signal to be applied to LED chips 12 across the first and second mounting areas 38 and 40. Conductive vias 44 and surface mount areas 38 and 40 can comprise any suitably electrically conductive material and can be provided using any suitable technique, including techniques used for providing mounting area 14 and first and second electrical elements 16 and 18. It is understood that surface mount areas 38 and 40 and conductive vias 44 can be arranged in many different configurations, and can therefore comprise any suitable shape(s) and/or size(s). As conductive vias 44 connect electrical elements 16 and 18 to respective surface mount areas 38 and 40, it is also understood that electrical elements may be positioned in other arrangements in addition to the arrangement illustrated. Conductive vias 44 can form between respective surface mount areas 38 and 40 and electrical elements 16 and 18 which may not be substantially vertically arranged, but could also be arranged at an angle within submount 22. It is also understood that instead of vias 44, one or more intervening metal layers can be provided between one or more surfaces of the submount between the surface mount areas and electrical elements, or even along external side surfaces of submount 22 between respective surface mount areas and electrical elements.

As FIG. 5 illustrates, light emitter device 10 can further comprise a thermal element 46 disposed on a bottom surface of submount 22. Thermal element 46 can optionally be disposed between first and second mounting areas 38 and 40, respectively. In one aspect, thermal element 46 can be disposed in a central location with respect to submount 22 below the one or more LED chip 12. Thermal element 46 can comprise any thermally conductive material such as a metal, metal-alloy, Sn, Ag, Cu, etc., and can be in at least partial vertical alignment with LED chip 12. In one embodiment, thermal element 46 is electrically isolated from electrical elements 16 and 18 on top surface 20 of submount 22 as well as first and second surface mount areas 38 and 40 on the bottom surface of submount 22. Although heat from LED chip 12 can laterally spread over top surface 20 of submount 22 via mounting area 14 and electrical elements 16 and 18, more heat can pass into submount 22 directly below and around LED chip 12. Thermal element 46 can assist with heat dissipation by allowing heat to spread into thermal element 46 where it can dissipate more readily from the device. Heat can also be conducted from top surface 20 of the submount 22 through vias 44 where the heat can spread into first and second surface mount areas 38 and 40 where it can also dissipate. For devices using surface mount technology, the thickness of thermal element 46 and first and second surface mount areas 38 and 40 can be approximately the same such that all three make contact to a lateral surface such as a PCB. To improve wetting of the solder however, and to ensure a more robust contact between thermal element 46 and an external heat sink, thermal element 46 may extend away from the body of the device to a greater distance than surface mount areas. That is, it is contemplated that thermal element 46 can be thicker than surface mount areas 38 and 40. 32

Figure 8:
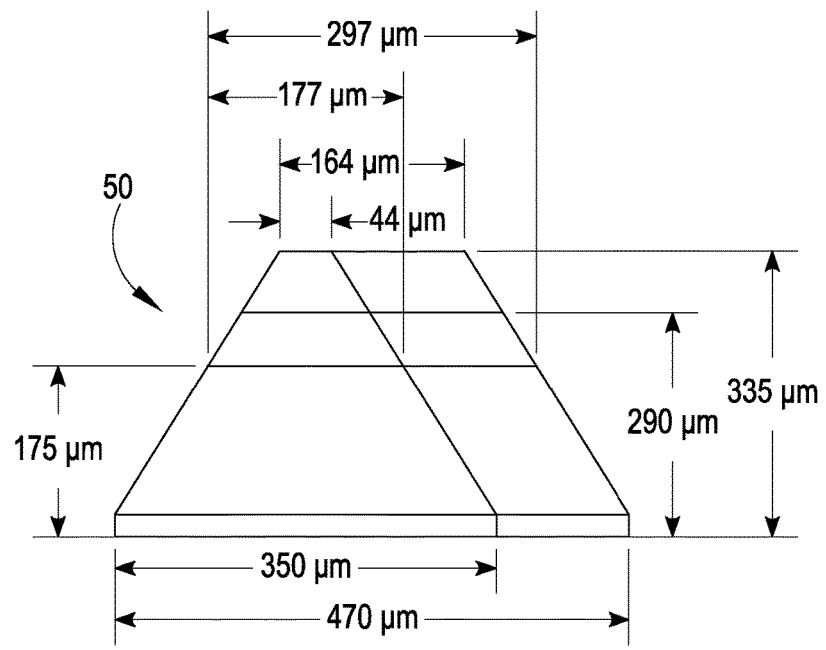

FIGS. 6A to 6C illustrate embodiments of LED chip 12 which can be partially disposed over portions of each of first and second elements 16 and 18 (FIG. 1), respectively. In FIG. 1, LED chip 12 was generically designated and consisted of one or more straight cut, or non-angled outer surfaces. However, LED chip 12 can comprise a substrate, generally designated 50, that is beveled cut, thereby providing a chip having angled or beveled surfaces disposed between an upper face and a lower face. Specifically, FIGS. 6A to 6C illustrate an embodiment where LED chip 12 is a substantially square shaped chip where adjacent surfaces 52 and 54 can comprise substantially the same length or width (e.g., W1 and W2, FIG. 6C). However, FIG. 8 illustrates an embodiment where the substrate of LED chip 12 can comprise a substantially rectangular shaped chip where adjacent surfaces 52 and 54 are different lengths or widths (e.g., W1 and W2, FIG. 6C). As FIG. 6C illustrates and in one aspect, a first width W1 and a second width W2 associated with adjacent sides 52 and 54, respectively, can be approximately 1 mm in length (e.g., 1000 µm) or less in at least one direction. In other aspects, the first width W1 and the second width W2 associated with adjacent sides 52 and 54, respectively, can comprise approximately 0.85 mm (e.g., 850 µm) in length or less in at least two directions, such as approximately 0.70 mm (e.g., 700 µm), 0.50 mm (e.g., 500 µm), 0.40 mm (e.g., 400 µm), and 0.30 mm (e.g., 300 µm) or less. LED chip 12 can comprise a thickness t of approximately 0.40 mm or less (e.g., 400 µm or less) such as 0.34 mm (e.g., 340 µm) or less. In one aspect and as illustrated in FIG. 6B, LED chip 12 can comprise a thickness t of approximately 0.335 mm (e.g., 335 µm) or various sub-ranges of thicknesses t from 0.15 to 0.34 mm such as approximately 0.15 to 0.17 mm (e.g., 150 to 170 µm); 0.17 to 0.2 mm (e.g., 170 to 200 µm); 0.2 to 0.25 mm (e.g., 200 to 250 µm); 0.25 to 0.30 mm (e.g., 250 to 300 µm); and 0.30 to 0.34 mm (300 to 340 µm).

In one aspect, LED chip 12 can comprise an area, generally designated A2 (e.g., the product of the maximum widths W1 and W2 of adjacent sides 52 and 54) of approximately 0.74 mm$^2$ or less, for example, 0.72 mm$^2$ or less. In other aspects, LED chips 12 can be various sub-ranges of surface area A2 from approximately 0.25 to 0.72 mm$^2$, for example, approximately 0.25 to 0.31 mm$^2$; 0.31 to 0.36 mm$^2$; 0.36 to 0.43 mm$^2$; 0.43 to 0.49 mm$^2$; 0.49 to 0.56 mm2; 0.56 to 0.64 mm$^2$; and 0.64 to 0.72 mm$^2$. In one aspect, an upper face 56 can comprise a smaller surface area than a lower face 58. One or more beveled or angled sides, such as adjacent surfaces 52 and 54 can be disposed between upper and lower faces 56 and 58, respectively. At least one groove, such as an X-shaped groove 60 can be disposed in upper face 56 of LED chip 12. Multiple X-shaped grooves and/or other shaped grooves can also be provided. In one aspect, grooves 60 can improve light extraction.

As illustrated by FIG. 6C, LED chip 12 can comprise electrical contacts on the same surface, for example, bottom face 58. Electrical contacts can comprise an anode 62 and a cathode 64 which can collectively occupy at least approximately 90% of the active diode region. Anode 62 can be at least partially disposed over and electrically communicate with first electrical element 16 (FIG. 1). Cathode 64 can be at least partially disposed over and electrically communicate with second electrical element 18 (FIG. 1). A gap 66 can be disposed between anode 62 and cathode 64. In one aspect, gap 66 can for example be approximately 75 µm or less. After die attachment of LED chip 12 to mounting pad 14 extending from electrical element 18, gap 66 can be at least partially disposed over gap G of device 10 (FIG. 1).

In one aspect, LED chip 12 can comprise a direct attach type of chip that is horizontally structured such that electrically connecting chip to electrical components wire bonding is not required. That is, LED chip 12 can comprise a horizontally structured device where each electrical contact (e.g., the anode and cathode) can be disposed on the bottom surface of LED chip 12. Die attaching LED chip 12 using any suitable material and/or technique (e.g., solder attachment, preform attachment, flux or no-flux eutectic attachment, silicone epoxy attachment, metal epoxy attachment, thermal compression attachment, and/or combinations thereof) can directly electrically connect LED chip 12 to first and second elements 16 and 18 (FIG. 1) without requiring wire bonds.

Figure 7:
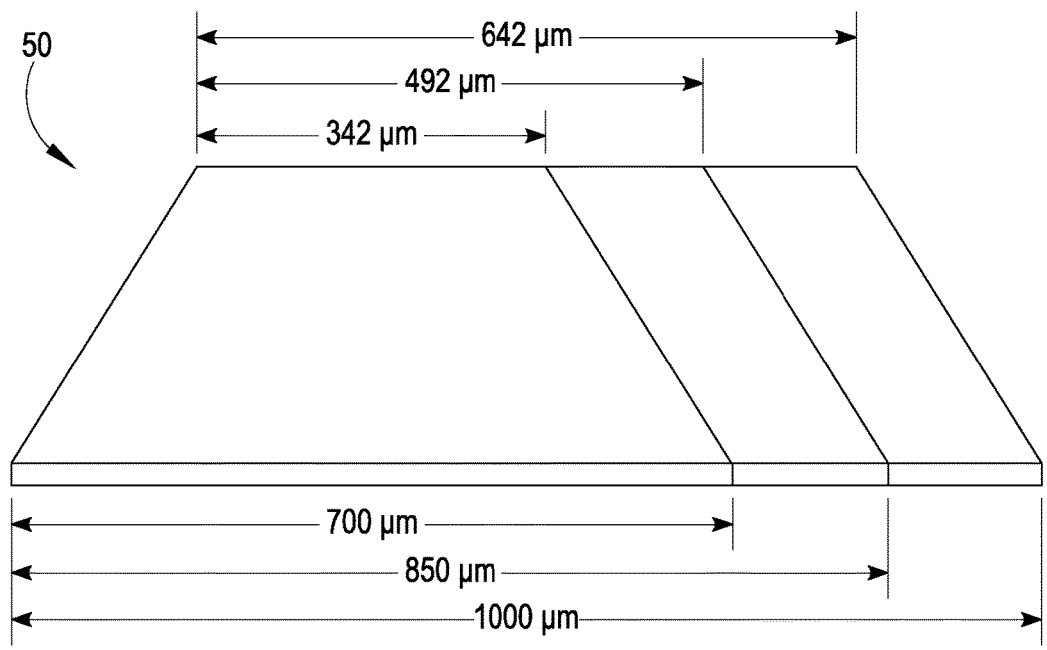
FIGS. 7 and 8 illustrate various geometries associated with light emitting chips according to the subject matter herein.

FIGS. 7 and 8 illustrate various measurements of LED chip substrate 50. FIG. 7 illustrates various maximum dimensions for square adjacent sides 52 and 54. FIG. 8 illustrates various maximum dimensions for rectangular chips where adjacent sides 52 and 54 are different, for example, where side 52 is smaller than side 54. FIG. 8 illustrates various dimensions of the smaller and larger sides 52 and 54 of LED chip substrate 50 thickness. In one aspect, adjacent sides 52 and 54 can comprise approximately 350 µm×470 µm and can comprise a thickness, or height, of approximately 175 µm. In other aspects, substrate thickness 50 can have a height of approximately 290 µm. In further aspects, substrate thickness 50 can have a height of approximately 335 µm (e.g., 0.335 mm). In one aspect, upper face 56 can be a rectangle of approximately 177 µm×297 µm in length and width. In other aspects, upper face can be a rectangle of approximately 44 µm×164 µm in length and width. Such LED chips 12 can have a ratio between area of upper face 56 and maximum area of adjacent sides 52 and 54 of approximately 0.4 or less. It has been found that the light extraction can be improved as the ratio of the area of upper face 56 to the maximum area of sides 52 and 54 is reduced.

Notably, LED chips 12 selected for use have been improved to advantageously increase light extraction efficiency. For example, in one aspect, the ratio of LED chip size (e.g., chip length or width, previously described with respect to FIGS. 6A to 6C) to lens 30 size (e.g., lens diameter D1 previously described with respect to FIGS. 3A to 4) can be minimized to increase the light extraction efficiency. One way to minimize such ratio is to increase lens 30 size, for example, by decreasing edge exclusion E (FIGS. 3A, 4) and/or to decrease LED chip 12 size. As light emitter devices and packages become smaller and smaller, using smaller chips can be important, however, LED chips 12 selected for use can be reduced and improved with respect to other device features as described herein. Such reductions and improvements can produce unexpected results and the ratio between LED chip size and lens size is unexpected to consider, as conventional wisdom has simply relied on incorporating smaller LED chips into smaller devices, without considering chip size in relation to other package or device features, such as lens size and/or selection based upon an LED chip to lens ratio. In one aspect and as previously described, LED chips 12 can have a length and a width of approximately 0.85 mm in length or less. In one aspect and as previously described, lens 30 can have a lens size or diameter of approximately 2.172 mm or more (depending upon edge exclusion, E). The chip size to lens size (e.g., width of LED chip 12 to width or diameter of lens 30) ratio can be improved to be approximately 0.4 or less. In one aspect, the chip to lens ratio can be 0.391 or less and any sub-range including approximately 0.1 to 0.2; 0.2 to 0.3; or 0.3 to 0.4. Minimizing the ratio between chip and lens sizes can increase the light extraction efficiency.

A ratio of width of LED chip 12 to width of submount 22 (e.g., SW1 and/or SW2, FIGS. 3A and 3B) can also be reduced and improved for advantageously increasing light extraction. In this aspect, it can be desirable to achieve the smallest ratio possible for increasing light extraction. For example and in one aspect, the ratio between the width of LED chip 12 (e.g., maximum measurement of sides 52 and/or 54) to the width of submount 22 can be approximately 0.35 or less. Any sub-range of ratio between approximately zero (0) and 0.35 is contemplated however, for example, 0 to 0.1; 0.1 to 0.2; 0.2 to 0.3; and greater than 0.3. By improving this ratio, device 10 can be tuned to achieve the best possible performance relative to the device footprint. Miniaturized devices must still maintain and/or exceed brightness levels, which can be accomplished in part by reducing and improving various package dimensions and/or ratios.

In accordance with the subject matter disclosed herein, such as for example by way of the description provided above and in the various drawings, it is envisioned that smaller size light emitter devices with desirable light output can be provided with any or all of the features described above, and in any suitable combination or a variety of feature combinations with one or more of the various features described herein.

Embodiments of the present disclosure shown in the drawings and described above are exemplary of numerous embodiments that can be made within the scope of the appended claims. It is contemplated that the novel light emitter devices having improved light extraction and methods of making the same can comprise numerous configurations other than those specifically disclosed. It is also contemplated that the reduced and improved dimensions, sizes, and/or ratios disclosed herein for providing improved light extraction can be scalable and suitable for any given size and/or shape of light emitter device.

What is claimed is:

1. A light emitter device comprising:
   a submount having a surface comprising a length, a width, and a planar surface area of 6 square millimeters ($mm^2$) or less;
   first and second electrical elements disposed over the upper surface of the submount;
   a light emitting chip disposed over the submount, wherein the light emitting chip electrically communicates with the first and second electrical elements, and wherein the first and second electrical elements extend radially outwardly from a center of the submount and around each edge of the light emitting chip, so as to extend towards each edge of the submount to occupy a majority of the planar surface area; and
   a lens formed over the light emitting chip and the submount from a material and/or encapsulant dispensed over the submount and light emitting chip in liquid form, wherein the lens comprises a circular lens base, a substantially solid hemispheric portion extending above the circular lens base, and a protective layer extending around the circular lens base, wherein the circular lens base comprises a circular diameter of a constant value in all directions coplanar with the circular lens base, wherein the circular diameter is substantially equal to the length or the width of the submount for maximizing light extraction therefrom;
   wherein substantially all of the planar upper surface of the submount located radially inside the circular lens base is occupied by the first and second electrical elements;
   wherein a portion of each of the first and second electrical elements extends along the planar upper surface outside the circular lens base towards a respective edge of the planar upper surface;
   wherein the light emitter device is operable for emitting light at 100 lumens or more at 350 milliamps (mA); and
   wherein the light emitter device has a maximum height of 1.85 mm.

2. The light emitter device of claim 1, wherein the lens comprises an apex centrally disposed above a center of the submount.

3. The light emitter device of claim 1, wherein the lens comprises an apex located off-center with respect to the submount.

4. The light emitter device of claim 1, wherein the lens comprises more than one apex, each of which are of equal height.

5. The light emitter device of claim 1, wherein the light emitting chip has a width of 0.85 mm or less in at least two directions.

6. The light emitter device of claim 1, wherein the light emitting chip has a thickness of 0.34 mm or less.

7. The light emitter device of claim 1, wherein the lens has a radius of 1.0 mm or more.

8. The light emitter device of claim 1, wherein a ratio of a width of the light emitting chip to a width of the submount is 0.35 or less.

9. The light emitter device of claim 1, wherein a ratio of a width of the lens to a width of the submount is 0.85 or more.

10. The light emitter device of claim 1, wherein a ratio of a planar surface area of the circular lens base to the surface area of the submount is 0.63 or more.

11. The light emitter device of claim 1, wherein a ratio of a width of the light emitting chip to a width of the lens is 0.4 or less.

12. The light emitter device of claim 1, wherein the light emitter device has an edge exclusion between the lens and an edge of the submount of between 0.3 and zero (0) mm.

13. The light emitter device of claim 12, wherein the light emitter device has an edge exclusion of zero (0) such that the lens extends all the way to at least one edge of the submount.

14. The light emitter device of claim 13, wherein the light emitter device has an edge exclusion of zero (0) on more than one edge of the submount such that the lens extends all the way to at least two or more different edges of the submount.

15. The light emitter device of claim 1, wherein the light emitter device comprises four lateral side edges and an edge exclusion of zero (0) for each lateral side edge of the submount such that the lens extends all the way to each lateral side edge of the submount.

16. The light emitter device of claim 1, wherein the device further comprises top side electrical contacts.

17. A light emitter device comprising:
a submount having a surface comprising a planar surface area of less than 6 mm$^2$;
first and second electrical elements disposed over the surface of the submount, wherein the first and second electrical elements radially extend from a center of the submount so as to extend towards each edge of the submount and to occupy a majority of the planar surface area;
a light emitting chip over the submount and electrically connected to the first and second electrical elements; and
a lens formed over the light emitting chip and the submount from a material and/or encapsulant dispensed over the submount and light emitting chip in liquid form, wherein the lens comprises a circular lens base having a circular diameter of a constant value in all directions coplanar with the circular lens base, a substantially solid hemispheric portion extending above the circular lens base, and a protective layer extending around the circular lens base;
wherein substantially all of the planar upper surface of the submount located radially inside the circular lens base is occupied by the first and second electrical elements;
wherein a portion of each of the first and second electrical elements extends along the planar upper surface outside the circular lens base towards a respective edge of the planar upper surface;
wherein portions of the protective layer that are disposed between a diameter of the lens and an edge of the submount comprise a length measuring between 0.3 and zero (0) mm for maximizing light extraction; and
wherein the light emitter device is operable for emitting light at 100 lumens or more at 350 milliamps (mA).

18. The device of claim 17, wherein the submount comprises a width of 2.5 mm or less and a length of 2.5 mm or less.

19. The device of claim 17, wherein the lens comprises an apex centrally disposed above a center of the submount.

20. The device of claim 17, wherein the lens comprises an apex located off-center with respect to the submount.

21. The device of claim 17, wherein the lens comprises more than one apex, each of which are of equal height.

22. The device of claim 17, wherein the light emitting chip has a width of 0.85 mm or less in at least two directions.

23. The device of claim 17, wherein the light emitting chip has a thickness of 0.34 mm or less.

24. The device of claim 17, wherein the lens has a radius of 1.0 mm or more.

25. The device of claim 17, wherein the light emitter device has a height of 1.85 mm or less.

26. The device of claim 17, wherein the circular diameter of the circular lens base is equal to a length or a width of the submount.

27. The device of claim 26, wherein the circular diameter of the circular lens base is equal to a length and a width of the submount.

28. The device of claim 17, wherein the light emitter device comprises four lateral side edges and an edge exclusion of zero (0) for each lateral side edge of the submount such that the lens extends all the way to each lateral side edge of the submount.

29. The device of claim 17, wherein the device further comprises top side electrical contacts.

30. A light emitter device comprising:
a submount having a surface area of less than 6 mm$^2$;
a light emitting chip on the submount; and
a lens formed over the light emitting chip and the submount from a material and/or encapsulant dispensed over the submount and light emitting chip in liquid form, wherein the lens comprises a circular lens base, a substantially solid hemispheric portion extending above the circular lens base, and a protective layer extending around the circular lens base, wherein the circular lens base comprises a circular diameter of a constant value in all directions coplanar with the circular lens base, wherein the circular diameter is substantially equal to a length or a width of the submount for maximizing light extraction therefrom;
wherein substantially all of the planar upper surface of the submount located radially inside the circular lens base is occupied by first and second electrical elements;
wherein a portion of each of the first and second electrical elements extends along the planar upper surface outside the circular lens base towards a respective edge of the planar upper surface;
wherein a first ratio of a width of the light emitting chip to a width of the submount is 0.35 or less;
wherein a second ratio of a surface area of the circular lens base to a surface area of the submount is 0.63 or more; and
wherein a third ratio of a width of the light emitting chip to the diameter of the lens is 0.4 or less; and
wherein the light emitter device is operable for emitting light at 100 lumens or more at 350 milliamps (mA).

31. The device of claim 30, wherein the lens comprises an apex centrally disposed above a center of the submount.

32. The device of claim 30, wherein the device further comprises top side electrical contacts.

33. A method of providing light from a light emitter device, the method comprising:
providing a light emitter device comprising:
a submount having a length, a width, and a surface area of 6 mm$^2$ or less;

a light emitting chip on the submount, wherein the light emitting chip comprises beveled sides extending from a base of the chip, wherein the light emitting chip is electrically connected to first and second electrical elements that radially extend outwardly from a center of the submount and around each edge of the light emitting chip, so as to extend towards each edge of the submount to occupy a majority of the planar surface area; and a lens formed over the light emitting chip and the submount from a material and/or encapsulant dispensed over the submount and light emitting chip in liquid form, wherein the lens comprises a circular lens base, a substantially solid hemispheric portion extending above the circular lens base, and a protective layer extending around the circular lens base, wherein the circular lens base comprises a constant diameter of a constant value in all directions coplanar with the circular lens base, wherein the circular diameter is substantially equal to the length or the width of the submount for maximizing light extraction therefrom;

wherein the light emitter device has a maximum height of 1.85 mm; and wherein substantially all of the planar upper surface of the submount located radially inside the circular lens base is occupied by the first and second electrical elements;

wherein a portion of each of the first and second electrical elements extends along the planar upper surface outside the circular lens base towards a respective edge of the planar upper surface; and emitting light from the light emitter device with a light output of 100 lumens or higher at 350 milliamps (mA).

34. The method of claim 33, wherein the lens comprises an apex centrally disposed above a center of the submount.

35. The method of claim 33, wherein the lens comprises an apex located off-center with respect to the submount.

36. The method of claim 33, wherein the lens comprises more than one apex, each of which are of equal height.

37. The method of claim 33, wherein the light emitting chip has a width of 0.85 mm or less in at least two directions.

38. The method of claim 33, wherein the light emitting chip has a thickness of 0.34 mm or less.

39. The method of claim 33, wherein the circular lens base has a radius of 1.0 mm or more.

40. The method of claim 33, wherein a ratio of a width of the light emitting chip to the width of the submount is 0.35 or less.

41. The method of claim 33, wherein a ratio of the circular diameter of the circular lens base to the width of the submount is 0.9 or more.

42. The method of claim 33, wherein a ratio of a planar surface area of the circular lens base to the planar surface area of the submount is 0.63 or more.

43. The method of claim 33, wherein a ratio of width of the light emitting chip to a diameter of the lens is 0.4 or less.

44. The method of claim 33, wherein the light emitter device comprises top side electrical contacts.

* * * * *